(12) United States Patent
Anikitchev et al.

(10) Patent No.: US 10,665,504 B2
(45) Date of Patent: May 26, 2020

(54) LASER-BASED SYSTEMS AND METHODS FOR MELT-PROCESSING OF METAL LAYERS IN SEMICONDUCTOR MANUFACTURING

(71) Applicant: Veeco Instruments Inc., Plainview, NY (US)

(72) Inventors: Serguei Anikitchev, Hayward, CA (US); Andrew M. Hawryluk, Los Altos, CA (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

(21) Appl. No.: 16/036,993

(22) Filed: Jul. 17, 2018

(65) Prior Publication Data

US 2019/0035682 A1    Jan. 31, 2019

Related U.S. Application Data

(60) Provisional application No. 62/538,412, filed on Jul. 28, 2017.

(51) Int. Cl.
*H01L 21/768* (2006.01)
*H01L 21/67* (2006.01)
*H01L 21/66* (2006.01)

(52) U.S. Cl.
CPC .. *H01L 21/76894* (2013.01); *H01L 21/67138* (2013.01); *H01L 21/76883* (2013.01); *H01L 22/12* (2013.01)

(58) Field of Classification Search
CPC ............... H01L 21/76894; H01L 21/67138
USPC ............................................................. 438/16
See application file for complete search history.

(56) References Cited

U.S. PATENT DOCUMENTS

| | | |
|---|---|---|
| 3,931,458 A | 1/1976 | Dini |
| 4,348,263 A | 9/1982 | Draper et al. |
| 4,482,375 A | 11/1984 | Sastry et al. |
| 4,674,176 A | 6/1987 | Tuckerman |
| 5,093,279 A | 3/1992 | Andreshak et al. |
| 6,326,219 B2 | 12/2001 | Markle et al. |
| 6,335,253 B1 | 1/2002 | Chong et al. |
| 6,366,308 B1 | 4/2002 | Hawryluk et al. |
| 6,635,541 B1 | 10/2003 | Talwar et al. |
| 6,645,838 B1 | 11/2003 | Talwar et al. |
| 6,777,275 B1 | 8/2004 | Kluth |
| 6,777,317 B2 | 8/2004 | Seibel et al. |

(Continued)

FOREIGN PATENT DOCUMENTS

WO     2001097275 A1     12/2001

*Primary Examiner* — Igwe U Anya
(74) *Attorney, Agent, or Firm* — Downs Rachlin Martin PLLC

(57) ABSTRACT

Methods disclosed herein include scanning a focus spot formed by a laser beam over either a metal layer or IC structures that include a metal and a non-metal. The focus spot is scanned over a scan path that includes scan path segments that partially overlap. The focus spot has an irradiance and a dwell time selected to locally melt the metal layer or locally melt the metal of the IC structures without melting the non-metal. This results in rapid melting and recrystallization of the metal, which decreases the resistivity of the metal and results in improved performance of the IC chips being fabricated. Also disclosed is an example laser melt system for carrying out methods disclosed herein is also disclosed.

25 Claims, 8 Drawing Sheets

(56) References Cited

U.S. PATENT DOCUMENTS

| | | | |
|---|---|---|---|
| 6,888,853 B1 | 5/2005 | Jurgensen | |
| 7,514,305 B1* | 4/2009 | Hawryluk | H01L 21/67115 |
| | | | 438/166 |
| 8,728,387 B2 | 5/2014 | Jones et al. | |
| 9,490,128 B2 | 11/2016 | Wang et al. | |
| 2003/0029212 A1 | 2/2003 | Im | |
| 2005/0013328 A1* | 1/2005 | Jurgensen | B23K 26/0604 |
| | | | 372/6 |
| 2005/0040147 A1 | 2/2005 | Hoebel et al. | |
| 2008/0295882 A1* | 12/2008 | Stephens | H01L 31/0236 |
| | | | 136/244 |
| 2010/0276405 A1* | 11/2010 | Cho | H01L 23/5258 |
| | | | 219/121.72 |
| 2016/0086849 A1* | 3/2016 | Gluschenkov | H01L 21/76834 |
| | | | 438/662 |
| 2016/0181120 A1* | 6/2016 | Hawryluk | H01L 21/324 |
| | | | 438/14 |
| 2016/0208415 A1* | 7/2016 | Bencher | C30B 19/08 |
| 2018/0045232 A1* | 2/2018 | Capostagno | B23K 26/0006 |
| 2019/0001440 A1* | 1/2019 | Zrodowski | B22F 3/1055 |

* cited by examiner

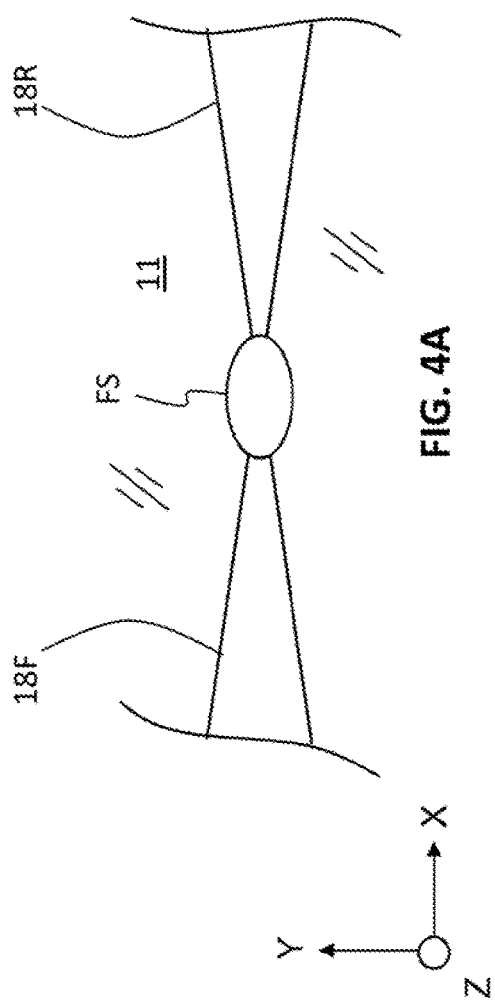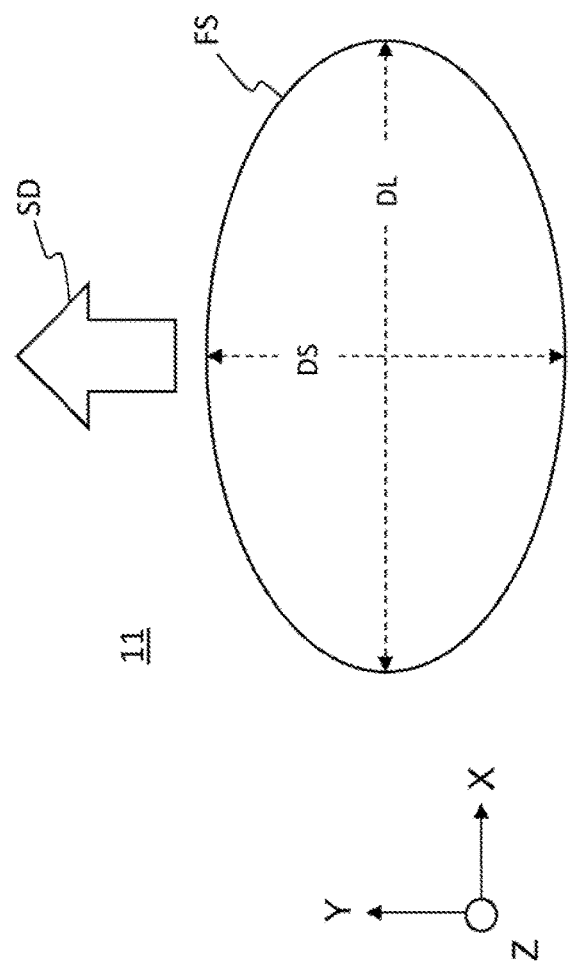

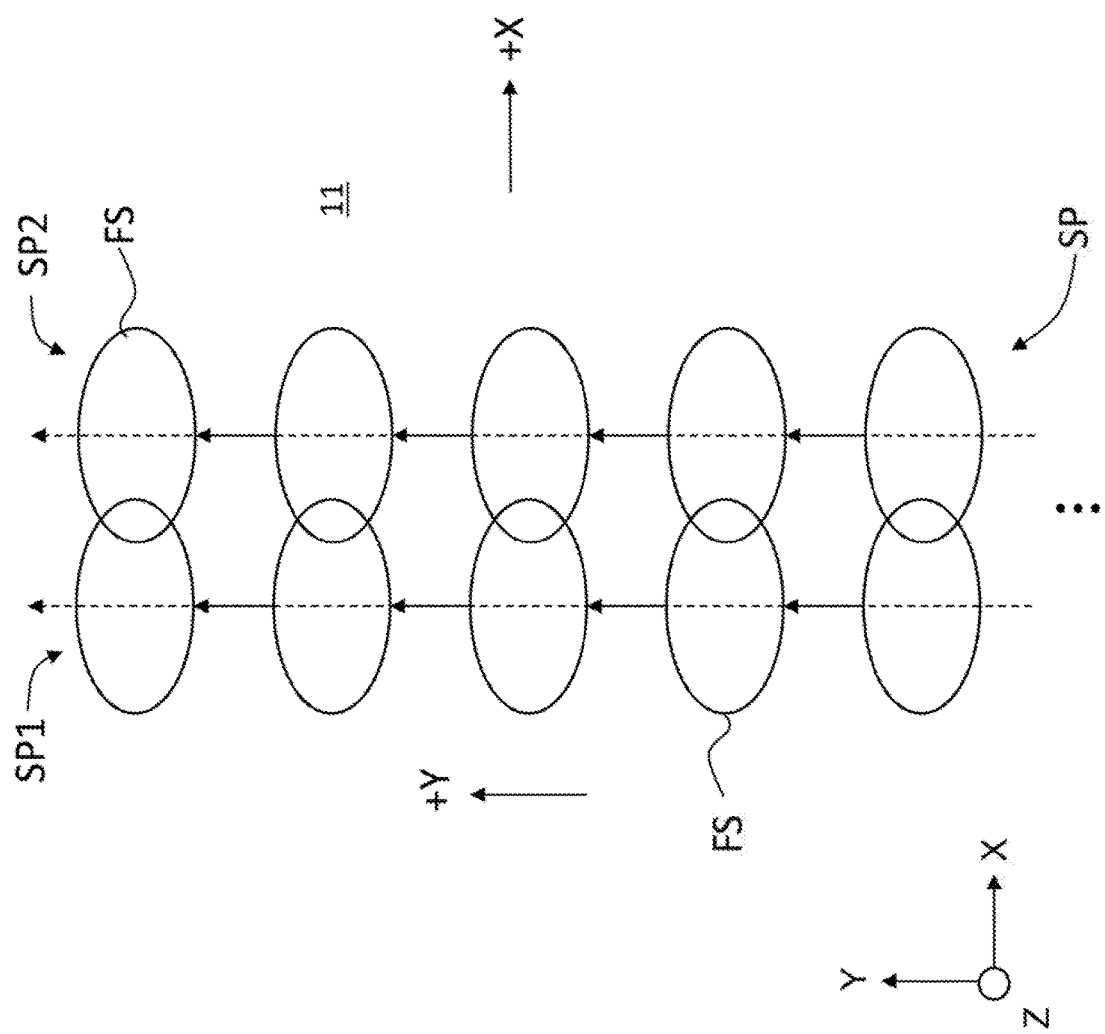

LASER-BASED SYSTEMS AND METHODS FOR MELT-PROCESSING OF METAL LAYERS IN SEMICONDUCTOR MANUFACTURING

RELATED APPLICATION DATA

This application claims the benefit of priority of U.S. Provisional Patent Application Ser. No. 62/538,412, filed Jul. 28, 2017, and titled "Laser-Based Systems and Methods for Melt-Processing of Metal Layers in Semiconductor Manufacturing", which is incorporated by reference herein in its entirety.

FIELD OF THE INVENTION

The present invention generally relates to the field of laser processing as used in semiconductor manufacturing to form and process integrated circuits, and in particular relates to laser-based systems and methods for melt-processing of metal layers in semiconductor manufacturing.

BACKGROUND

Semiconductor manufacturing involves the formation of integrated circuits (ICs), such as logic circuits and memory circuits. The fabrication of ICs involves forming microscopic three-dimensional structures in semiconductor (e.g., silicon) wafers to define the various circuit components, such as transistors, capacitors, electrical interconnections and electrical isolation features. The electrical interconnections typically run between different levels in the IC as well as within certain levels. The process of forming the ICs involves a large number (e.g., dozens or many dozens) of processing steps from the initial preparation of the wafer to the final packaging of the IC.

In the past, aluminum was the preferred metal for forming electrical interconnections. In 1997, the electrical interconnects were changed to copper due to its smaller resistivity, increased reliability and its ability to form smaller lines than aluminum.

While this change in the interconnect material from aluminum to copper has been advantageous, increasing integration requirements are placing even greater demands on IC performance. It would therefore be advantageous to have systems and methods that can improve the electrical performance of metal interconnects.

SUMMARY OF THE DISCLOSURE

An aspect of the disclosure is directed to a method of processing IC structures formed in a surface of a semiconductor wafer, with IC structure defined by at least one metal feature with a first melting temperature $T_1$ and at least one non-metal feature with a second melting temperature $T_2 > T_1$. The method comprises: forming a focus spot from a laser beam emitted by a continuous-wave or quasi-continuous wave laser, wherein the laser beam is P-polarized relative to the surface of the semiconductor wafer; and scanning the focused laser spot over the IC structures to irradiate both the at least one metal feature and the at least one non-metal feature such that the at least one metal feature melts and recrystallizes while the at least one non-metal feature does not melt.

Another aspect of the disclosure is directed to the above method, wherein the focused laser spot has an irradiance of at least $0.5 \times 10^7$ W/cm².

Another aspect of the disclosure is directed to the above method, wherein the scanning of the focused laser spot is performed using an F-θ scanning system that includes a scanning mirror.

Another aspect of the disclosure is directed to the above method, and further comprising controlling a duration of the laser beam by passing the laser beam through an acousto-optical modulator prior to the laser beam reaching the F-θ scanning system.

Another aspect of the disclosure is directed to the above method, wherein the focused laser spot has a dwell time $t_d$ in the range from 50 ns to 150 ns.

Another aspect of the disclosure is directed to the above method, wherein the laser beam has a wavelength of either 532 nm or 355 nm.

Another aspect of the disclosure is directed to the above method, further comprising measuring a change in a reflectivity of the at least one metal feature to determine whether the at least one metal feature melted during the scanning.

Another aspect of the disclosure is directed to the above method, further comprising directing the focused laser spot to the surface of the semiconductor wafer at an incident angle that is within 2 degrees of a Brewster angle for the at least one metal feature.

Another aspect of the disclosure is directed to the above method, wherein the metal comprises copper and the Brewster angle is about 70.5 degrees.

Another aspect of the disclosure is directed to the above method, wherein the scanning is carried out over multiple scan path segments that partially overlap.

Another aspect of the disclosure is directed to a method of processing a metal layer having a first resistivity and formed on a surface of a semiconductor wafer. The method comprises: forming a focused laser spot from a P-polarized laser beam emitted by a continuous-wave or quasi-continuous wave laser; and scanning the focused laser spot over the metal layer such that the metal layer locally melts and recrystallizes so that the metal layer has a second resistivity that is less than the first resistivity.

Another aspect of the disclosure is directed to the above method, wherein the focused laser spot has an irradiance of at least $0.5 \times 10^7$ W/cm².

Another aspect of the disclosure is directed to the above method, wherein the scanning of the focused laser spot is performed using an F-θ scanning system that includes a scanning mirror.

Another aspect of the disclosure is directed to the above method, and further comprising controlling a duration of the laser beam by passing the laser beam through an acousto-optical modulator prior to the laser beam reaching the F-θ scanning system.

Another aspect of the disclosure is directed to the above method, wherein the focused laser spot has a dwell time td in the range from 50 ns to 150 ns.

Another aspect of the disclosure is directed to the above method, wherein the laser beam has a wavelength of either 532 nm or 355 nm.

Another aspect of the disclosure is directed to the above method, further comprising measuring a change in a reflectivity of the metal layer to determine whether the metal layer locally melted during the scanning.

Another aspect of the disclosure is directed to the above method, further comprising directing the focused laser spot to the surface of the semiconductor wafer at an incident angle that is within 2 degrees of a Brewster angle for the metal layer.

Another aspect of the disclosure is directed to the above method, wherein the metal layer comprises copper.

Another aspect of the disclosure is directed to the above method, wherein the scanning is carried out over multiple scan path segments that partially overlap.

Another aspect of the disclosure is directed to a system for processing a semiconductor wafer that supports either a metal layer or integrated circuit structures having at least one metal feature. The system comprises: a continuous or quasi-continuous laser source configured to generate a laser beam that is P-polarized relative to the metal layer or the integrated circuit structures; an acousto-optical modulator that receives the laser beam and forms therefrom first and second laser beams, with the second laser beam being directed to a beam dump; and an F-θ scanning system configured to receive the first laser beam and form therefrom a focused laser beam that forms a focus spot FS that is scanned over either the metal layer or the IC structures to locally melt the metal layer or the at least one metal feature of the IC structures.

Another aspect of the disclosure is directed to the above system, wherein the metal layer or at least one metal feature is made of copper.

Another aspect of the disclosure is directed to the above system, wherein the laser beam has a wavelength of either 532 nm or 355 nm.

Another aspect of the disclosure is directed to the above system, wherein the focused laser beam is made incident on the metal layer or the at least one metal feature at an incident angle that is within 2 degrees of a Brewster angle for the metal that constitutes the metal layer or the at least one metal feature.

Another aspect of the disclosure is directed to the above system, and further comprising: a first power detector arranged to receive a portion of the first laser beam and generate a first detector signal SA; a second power detector arranged to receive reflected light from the focus spot that reflects from the at least one metal feature and generate a second detector signal SB; and a controller operably connected to the first and second power detectors and configured to receive the first and second detector signals SA and SB and calculate therefrom a reflectivity RS of the at least one metal feature or the metal layer.

Additional features and advantages are set forth in the Detailed Description that follows, and in part will be apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 4A is a close-up view of a light beam formed by the laser melt system, with the light beam forming a focus spot on the wafer surface and also forming a reflected light beam;

FIG. 4B is a close-up view of an example of the focus spot of FIG. 4A, with the arrow showing the scan direction;

FIG. 5 is a close-up view of the focus spot at different points in time as it moves over two adjacent scan path sections of a scan path;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

Laser Melt System

Figure 1:
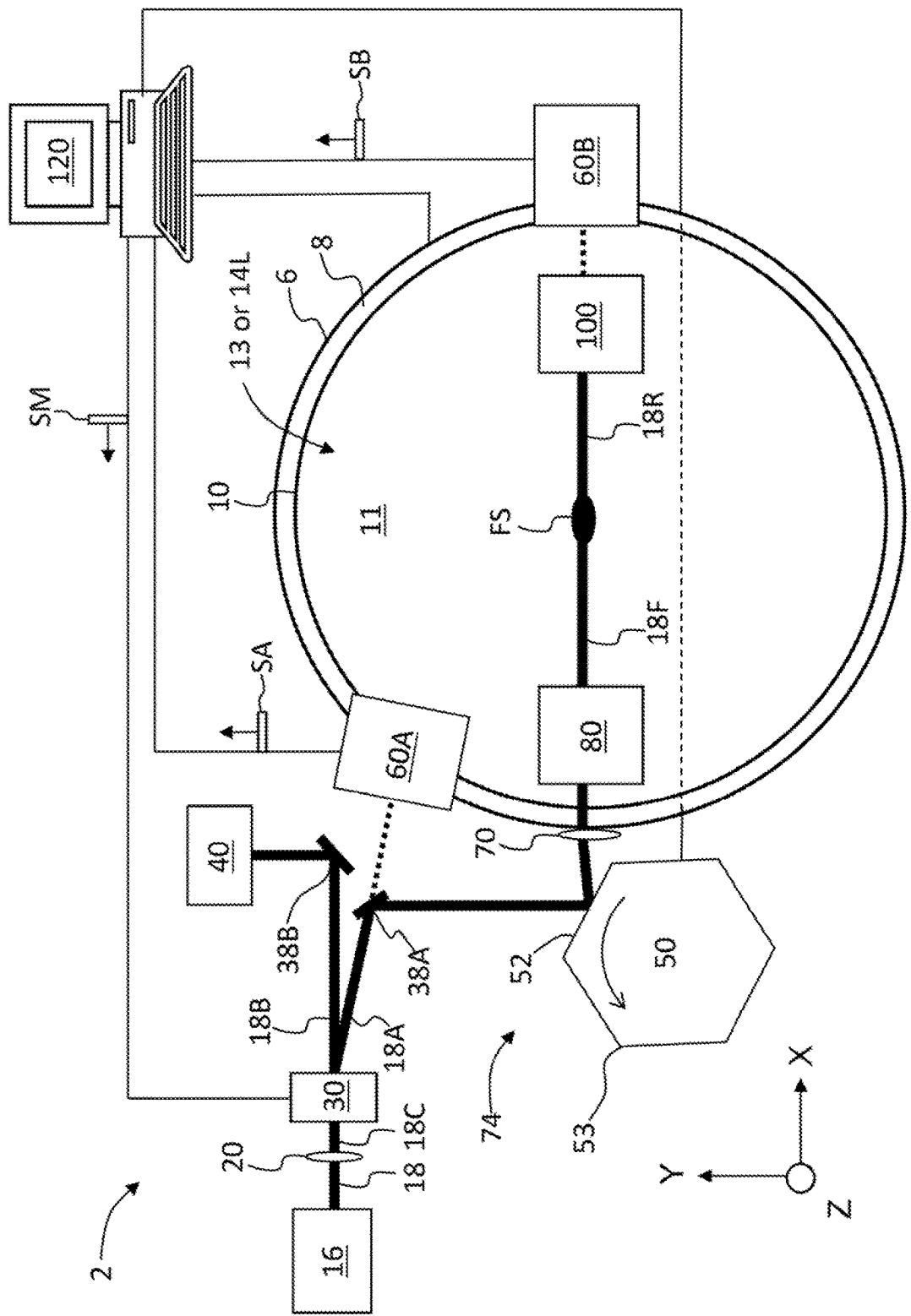
FIG. 1 is a top-down view and FIG. 2 is a side view of an example laser melt system according to the disclosure.
Figure 2:
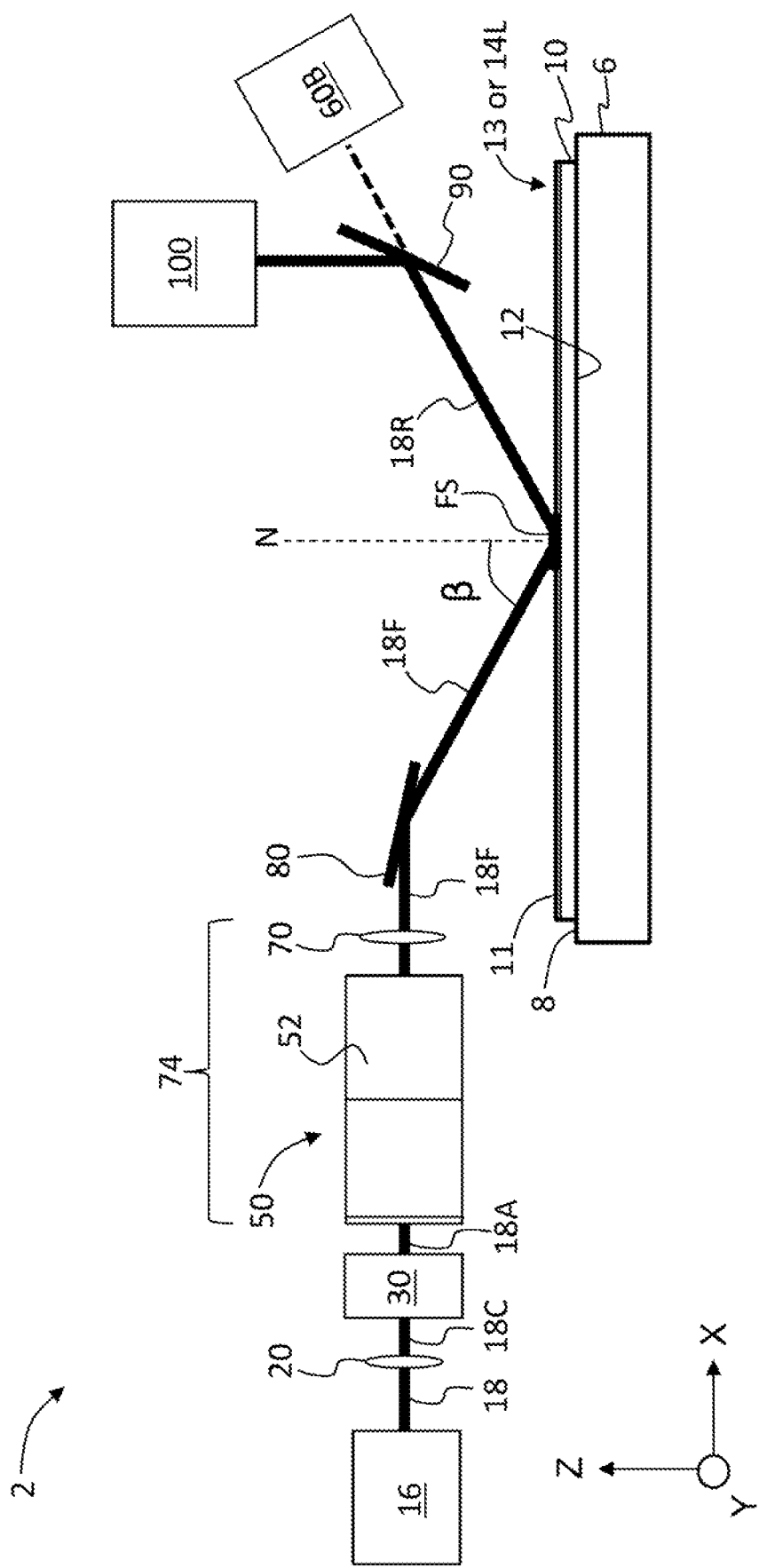

FIG. 1 is a top-down view and FIG. 2 is a side view of an example laser melt system ("system") 2 according to the disclosure. The system 2 includes a chuck assembly 6 that has a top surface 8 configured to support and secure a wafer 10. In an example, the chuck assembly 6 is configured to pre-heat the wafer 10 to a pre-heat temperature, e.g., 150° C.

Figure 3A:
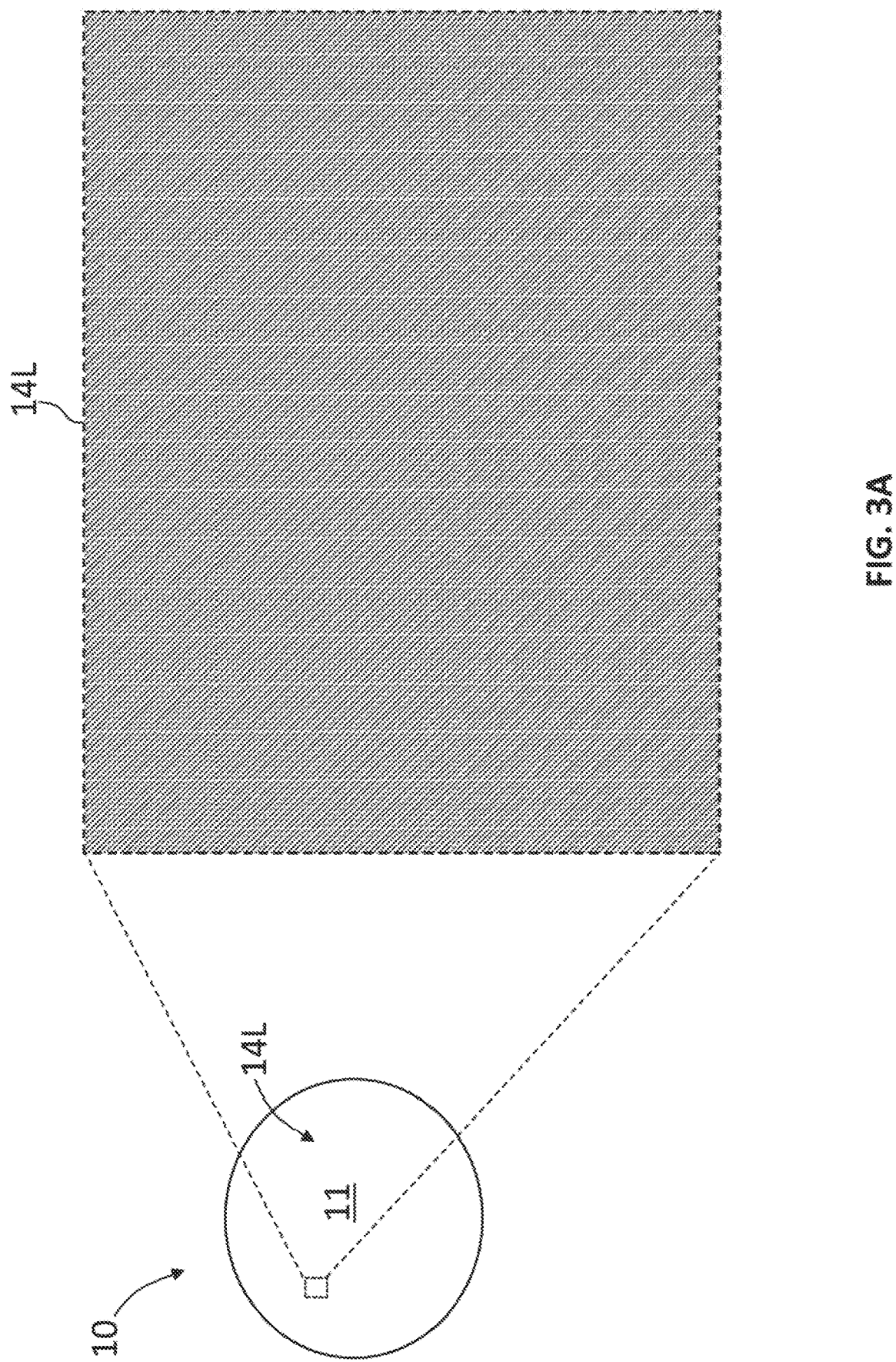
FIG. 3A is a top-down view of an example wafer surface comprising a metal layer.
Figure 3B:
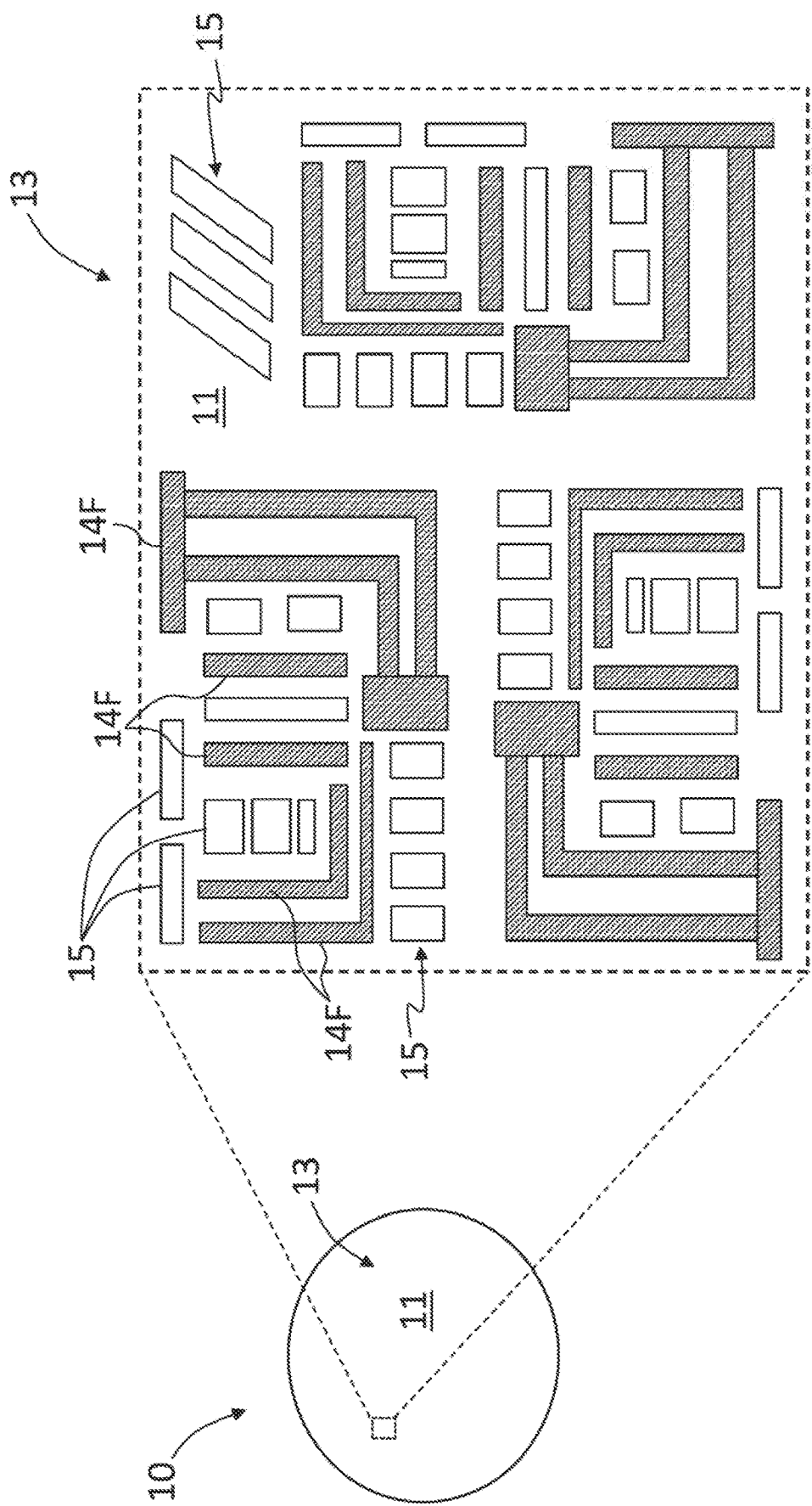
FIG. 3B is a top-down view of an example wafer surface comprising IC structures that include metal features and non-metal features.

The wafer 10 has a top surface ("wafer surface") 11 and a backside 12 (FIG. 2). FIG. 3A is a top-down close-up view of an example wafer surface 11 comprising a metal layer 14L. FIG. 3B is similar to FIG. 3A and shows an example of the wafer surface 11 comprising IC structures 13. The example IC structures 13 include metal features 14F and non-metal features 15. In an example, the metal features 14F are formed from the metal layer 14L of FIG. 3A using semiconductor processing techniques known in the art.

In examples, the at least one non-metal feature 15 in the IC structures 13 can comprise a dielectric material or a semiconductor material. In an example, the IC structures 13 can each include different types of non-metal features 15 (e.g., made of different materials), or the non-metal features can all be made of the same non-metal material. The example IC structures 13 shown in FIG. 3B each includes multiple metal features 14F and multiple non-metal features 15 by way of illustration, and these are referred to in the discussion below unless indicated otherwise. In an example, the metal features 14F can all be made of the same metal material. In other examples, the metal features 14F can be made of two or more different metal materials. In the discussion below, it is assumed a single metal material is used for the metal layer 14L or the metal features 14F.

The metal of metal layer 14L or metal features 14F has a first melt temperature $T_1$ while the material of the non-metal features 15 has a second melt temperature $T_2$, wherein $T_2 > T_1$. Examples of the metal for metal layer 14L and metal features 14F include copper, aluminum, gold, chromium, magnesium, manganese, nickel, and zinc. In an example where metal of the metal layer 14L and metal features 14F is copper, the first melt temperature is $T_1$ of 1085° C. An example dielectric non-metal feature 15 is $SiO_2$, which has a second melt temperature $T_2$ of 1710° C.

In an example, the IC structures 13 can comprise an upper part of a three-dimensional IC structure (not shown) formed on the wafer 10 as part of the process of fabrication of the three-dimensional IC circuit. In an example, the ICs being fabricated can have multiple metallization layers each comprising either metal features 14F or a continuous metal layer 14L, and the methods described herein can be applied to one or more of the metallization layers. In an example, the metal features 14F or metal layers 14L can be associated with front-end of the line (FEOL) fabrication, with back-end of the line (BEOL) fabrication, and/or the final packaging steps used to form the final IC product.

With reference again to FIGS. 1 and 2, the system 2 includes a laser source 16 that emits laser light 18. In an example, the laser source 16 comprises a continuous-wave (CW) or quasi-CW optical fiber laser. In an example, the laser light 18 has a wavelength λ of 532, while in another example the wavelength λ is 355 nm. In addition, an exemplary laser source 16 can have a repetition rate of 150 MHz with an average power of 500 W, a power tunability of between 1% and 100%, a pulse duration of 1.5 nanoseconds, a power stability of about +/−0.5%, and a beam quality of the TEM00 mode of M2<1.2. An example of such a laser source is the GLPN-500-R fiber laser from IPG Photonics, Inc., of Oxford, Mass. A collimating lens 20 can be disposed downstream of the laser source 16 to collimate the laser light 18 to form collimated light 18C.

The system 2 also includes an acousto-optical modulator (AOM) 30 arranged to receive the collimated light 18C and form therefrom first and second light beams 18A and 18B, which are respectively received by first and second mirrors 38A and 38B. The efficiency of the AOM 30 is about 85% so that when the laser light 18 has about 500 W of optical power, the first light beam 18A associated with a first diffracted order will have about 425 W of optical power while the second light beam 18B associated with the zeroeth diffracted order will have about 75 W of optical power. The AOM transmission (i.e., the amount of optical power in laser light beams 18A and 18B) can be controlled by controlling the voltage of the modulator control signal SM, introduced and discussed below.

The first mirror 38A is partially transmitting and so directs most (e.g., 99.5%) of the first light beam 18A to a scanning mirror device 50 while the remainder of the first light beam is transmitted to a first power detector 60A. The second mirror 38B directs the second light beam 18B to a beam dump 40. The AOM 30 is used to control the intensity and time duration of the first light beam 18A, as described below. In an example, the scanning mirror device 50 comprises a multifaceted scanning mirror with multiple (e.g., 40) reflective surfaces (facets) 52. The scanning mirror device 50 is shown in FIG. 1 with five facets 52 for ease of illustration.

An F-θ lens 70 is operably disposed relative to the scanning mirror device 50 to receive the first light beam 18A as it reflects from the scanning mirror device and forms therefrom a focused light beam 18F. Thus, the scanning mirror device 50 and the F-θ lens 70 constitute an F-θ scanning system 74. In an example, the F-θ lens 70 has a relatively small numerical aperture (NA), e.g., about 0.05.

As best seen in FIG. 2, a fold mirror 80 is used to direct the focused light beam 18F to the wafer surface 11. The focused light beam 18F is oriented to be P-polarized with respect to the x-y plane of the wafer surface 11 and is incident upon the wafer surface at a beam angle β relative to a surface normal N. In an example, the beam angle β is at or near (e.g., within 2 degrees of or more preferably within 1 degree of) the Brewster angle $\beta_B$ for the given metal on the wafer surface. In the case where the metal is copper and the wavelength λ=532 nm, the Brewster angle $\beta_B$ is about 70 degrees.

The focused light beam 18F forms a focus spot FS on the wafer surface 11, as seen, e.g., in FIG. 1 and also in the close-up views of FIGS. 4A and 4B. The focus spot FS is elongate (e.g., oval-shaped) and has a long dimension DL oriented in the x-direction and a short dimension DS oriented in the y-direction. In an example, the long dimension DL is between 2·DS and 5·DS. In an example, the short dimension DS is about 25 microns and the long dimension DL is about 75 microns. FIG. 4B shows the focus spot FS moving in a scan direction SD, as described in greater detail below.

A portion of the focus spot FS of the focused light beam 18F is reflected from the metal features 14F or metal layer 14L to form a reflected light beam 18R (FIGS. 1, 2, and 4A). In an example where the metal features 14F or the metal layer 14L is made of copper and focused light beam 18F is P-polarized, the reflected light beam 18R has an intensity of about 40% of the incident focused light beam 18F. The reflected light beam 18R is directed to a beam-splitting mirror 90 (FIG. 2), which directs a select portion (e.g., about 99.5%) to a beam dump 100 while transmitting the remaining portion (e.g., about 0.5%) to a second power detector 60B.

With reference to FIG. 1, the first and second power detectors 60A and 60B are operably connected to a controller 120 and respectively provide to the controller first and second detector signals SA and SB representative of the first and detected optical powers measured at the first and second detectors. The controller 120 is configured (e.g., with instructions in the form of software or firmware embodied in a non-transitory computer readable medium) to receive the detector signals SA and SB and measure a reflectivity RS of the wafer surface 11. In particular, the reflectivity RS is given by the calibrated ratio of the two signals, i.e., RS=SB/SA. The ratio RS can be used as an indicator of whether the metal features 14F or the metal layer 14L are melted, since the reflectivity of a metal drops when it undergoes a transition from the solid phase to the liquid phase.

The AOM 30 is also operably connected to the controller 120, which sends a modulator control signal SM to the AOM to control the operation of the AOM. In particular, the controller 120 monitors the intensity of the first light beam 18A via the first detector signal SA from the first power detector 60A and controls the AOM 30 to reduce temporal intensity fluctuations of the first light beam 18A. This closed-loop feedback control of the AOM 30 results in the first light beam 18A having temporal intensity fluctuations that in an example are less than 1% of the time-averaged intensity. In addition, the AOM 30 is turned on and off to act as a shutter so that the first light beam 18A remains "on" when incident on the different facets 52 of the scanning mirror device 50, but is turned "off" to avoid the first light beam being incident upon the vertices 53 between adjacent facets or the edges of the wafer.

The scanning mirror device 50 and the chuck assembly 6 are also operably connected to and controlled by the controller 120 to scan the focus spot FS over the wafer surface, as described below.

Scanning the Focus Spot Over the Wafer

System 2 is configured to scan the focus spot FS over the wafer surface 11, which as noted above can comprise the metal layer 14L (see FIG. 3A) or IC structures 13 having metal features 14F and non-metal features 15 (see FIG. 3B). The chuck assembly 6 is movable in the X-Y plane and is also adjustable in the Z-direction.

FIG. 5 is a close-up view of the focus spot FS as it moves over two adjacent scan path sections SP1 and SP2 of a scan path SP. In defining the scan path SP, the chuck assembly 6 can be moved in the −X-direction at a chuck speed SC while the focus spot FS can be moved (scanned) in the +Y-direction at a focus-spot speed SS. The operation of the chuck assembly 6 and the F-θ scanning system 74 is coordinated by the controller 120 so that the focus spot FS scans in the +Y-direction over a portion of the wafer surface 11 over a first scan path section SP1 and then scans again in the +Y direction over a second scan path section SP2 (adjacent to the first scan path), as shown in FIG. 5. The second scan path section SP2 is shifted in the +X-direction from the first scan path section SP1 so that it partially overlaps the first scan path, as shown in FIG. 5. Note that the width of each scan path section SP1 and SP2 is DL. In an example, the amount of overlap in adjacent scan paths is between 0.1·DL and 0.3·DL. In other examples, the amount of overlap in adjacent scan paths can be much greater, e.g., up to 0.9·DL.

In an example, the extent of scanning of the focus spot FS in the Y-direction is limited. In this case, the Y-position of the chuck 6 is adjusted after the chuck has moved over its range in the X-direction so that additional scan path sections SP1, SP2, . . . can be scanned in the Y-direction. This process can be repeated until the entire metal layer 14L is scanned or all of the IC structures 13 are scanned.

Figure 6A:
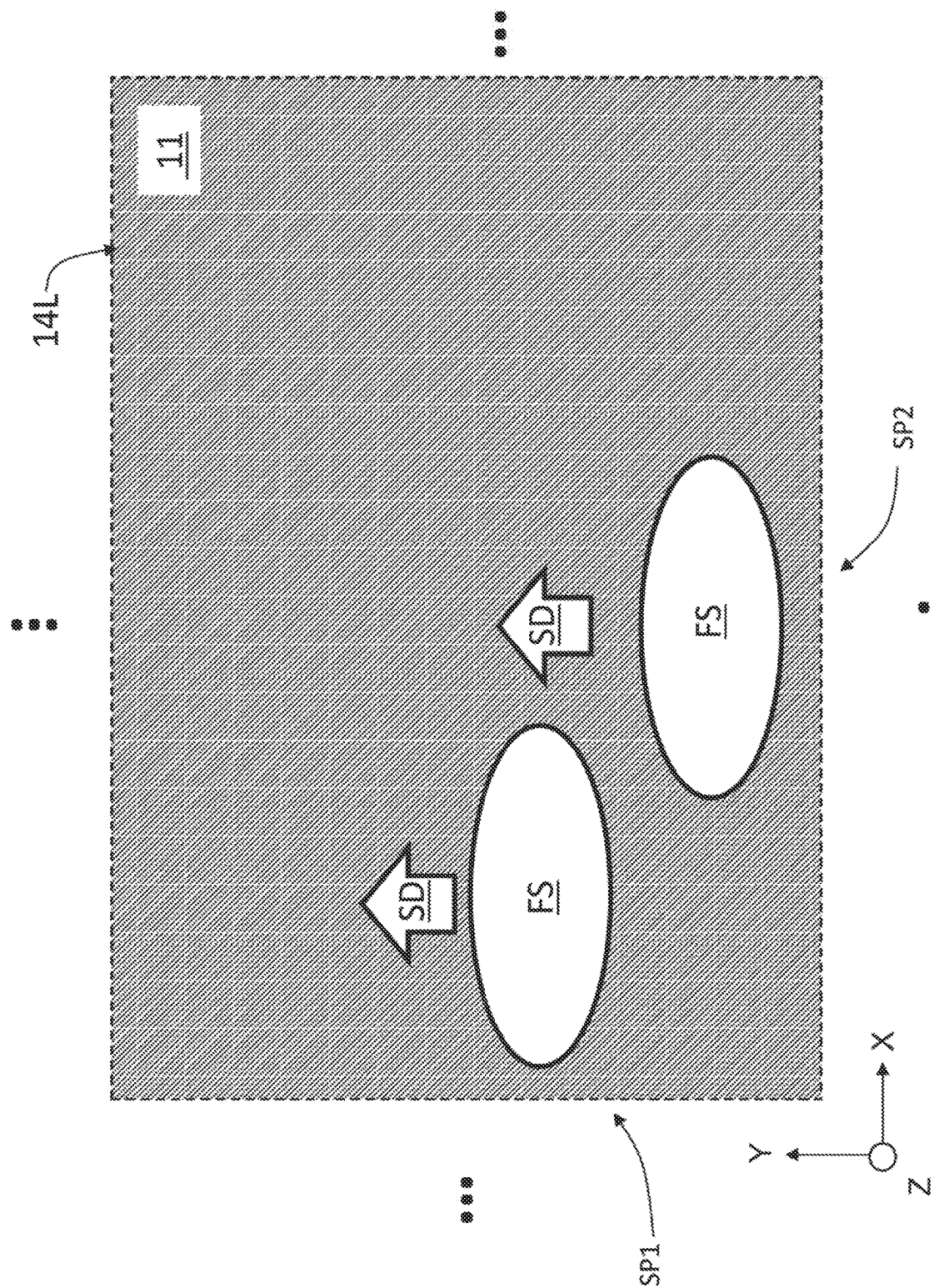
FIG. 6A is close-up views of a focus spot at two different points in time as it scans over the metal layer of the wafer.
Figure 6B:
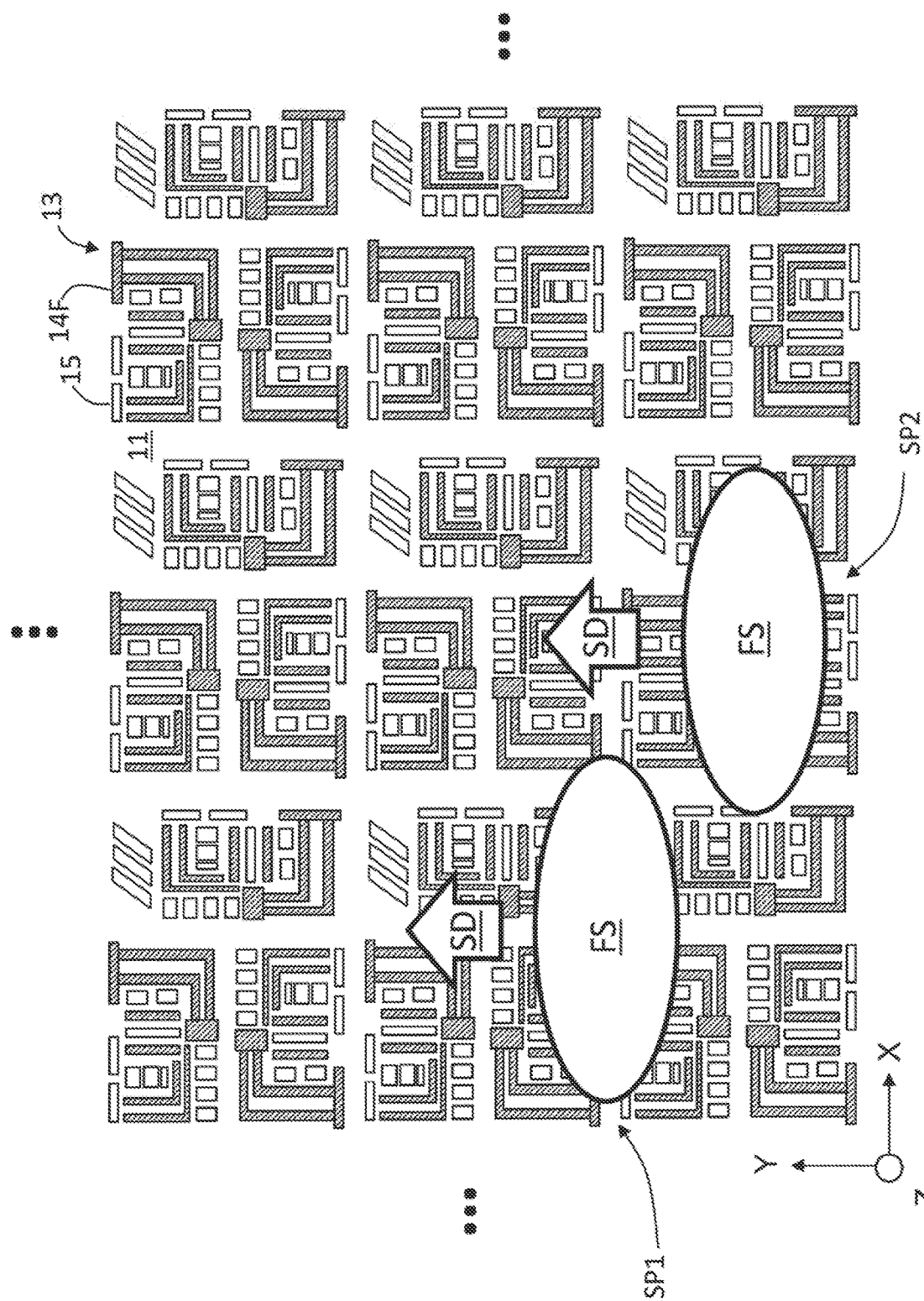
FIG. 6B is similar to FIG. 6A but for the case where the wafer surface comprises IC structures having metal and non-metal features.

FIG. 6A is a close-up view of the focus spot FS at two different points in time as it is scanned over the metal layer 14L over adjacent scan path sections SP1 and SP2, with the scan directions SD indicated by the arrows. FIG. 6B is similar to FIG. 6A but for the wafer surface 11 comprising IC structures 13. Thus, in the example of FIG. 6B, focus spot FS is scanned over both the metal features 14F and the non-metal features 15, i.e., it need not be selectively scanned over just the metal features. Note that in an example, the scan path SP can comprise a number of discrete scan path sections (SP1, SP2, . . . ) that run in the same direction (e.g., the Y-direction as shown in FIGS. 6A and 6B).

In an example, the scanning of the focus spot FS over the scan path SP is enabled by the AOM 30 turning on and off the first light beam 18A at the appropriate times based on the position of the chuck 6. For example, each time the chuck 6 has moved by a distance substantially equal to the long dimension DL or a select fraction thereof, the focus spot FS can be scanned in the Y-direction. In an example, the chuck speed SC associated with moving the wafer 10 is about 200 mm/s while the focus-spot speed SS of the scanned focus spot FS is about 600 m/s. At such relative speeds, the focus spot FS can move over an entire scan path section SP1, SP2, . . . in the Y-direction without the wafer having moved any substantial distance in the X-direction.

The focus spot FS has sufficient intensity and scan speed that amount of energy delivered to the wafer surface 11 is sufficient to locally melt the metal features 14F or to locally melt the metal layer 14L during the scanning process but not to melt the non-metal features 15, which as noted above have a melting temperature $T_2 > T_1$. In the case where the metal is copper, the first melting temperature $T_1$ is 1085° C. and the reflectance (reflectivity) is about 0.4 at or near the Brewster angle $\beta_B$ of about 70.5 degrees at a wavelength λ of 532 nm. In an example, the focus spot FS has an irradiance IR of at least $0.5 \times 10^7$ W/cm² and a dwell time $t_d$ (i.e., the amount of time the focus spot FS resides over a given point of a metal feature 14F) in the range from 50 ns to 150 ns. In an experiment, a metal layer 14L of copper with a thickness of 0.25 microns was brought from a pre-heat temperature of 150° C. to the melting temperature T1 of 1085° C. with a focus spot FS having an irradiance of $1.5 \times 10^7$ W/cm² and a dwell time $t_d$ of 50 ns.

The combination of the focus spot irradiance and the dwell time $t_d$ is chosen to quickly locally melt the metal of the metal features 14F or the metal layer 14L (without vaporizing the metal), while allowing for the melted metal to quickly cool and recrystallize when the focus spot FS moves away. This recrystallization process reduces the resistivity of the metal features 14F (as compared to the original resistivity) by enlarging the size of the crystal grain structure in the metal. In copper, the reduction in the resistivity is due to the larger crystal grain structure of the recrystallized metal features presenting a reduced mean-free path of the electrons. Thus, the laser-melt process provides the metal features 14F or metal layer 14L with a second resistivity that is less than the original or first resistivity.

Not all semiconductor materials have melting points greater than that of metals such as copper. For example, Germanium has a melting point of about 938° C. Thus, the methods disclosed herein of scanning the entire wafer surface to perform metal recrystallization may be restricted if the melting temperature $T_2$ of the non-metal features 15 falls below the melting temperature $T_1$ of the given metal to avoid melting the non-metal features 15 during the scanning process. For example, it may be best to skip the recrystallization methods disclosed herein for select metallization layers in the IC fabrication process for which $T_2 < T_1$.

The system 2 (FIGS. 1 and 20 may be configured to determine whether the metal that constitutes metal layer 14L or metal features 14F is actually melted during the scanning process. As noted above, it is known that the reflectivity of metals such as copper is smaller in the liquid (melted) state than in the solid state. Also discussed above, the reflectivity from the metal features 14F can be determined by the ratio of the first and second detector signals SA and SB from the first and second detectors 60A and 60B, i.e., RS=SB/SA. Thus, a substantial change in reflectivity of the metal features 14F or the metal layer 14L can be used to determine whether the metal of the metal features or metal layer has in fact locally melted during the scanning process, and to adjust the optical power from the laser source 16 or the scanning speeds (and thus the dwell time $t_d$) accordingly.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of processing integrated circuit (IC) structures formed in a surface of a semiconductor wafer, with the IC structures defined by at least one metal feature having a first melting temperature $T_1$ and at least one non-metal feature having a second melting temperature $T_2 > T_1$, the method comprising:
forming a focused spot from a laser beam emitted by a continuous-wave or quasi-continuous wave laser, wherein the laser beam is P-polarized relative to the surface of the semiconductor wafer; and
scanning the focused laser spot over the IC structures to provide the focused spot with a dwell time, $t_d$, of a length sufficient to irradiate both the at least one metal feature and the at least one non-metal feature such that the at least one metal feature melts and recrystallizes while the at least one non-metal feature does not melt.

2. The method according to claim 1, wherein the focused laser spot has an irradiance of at least $0.5 \times 10^7$ W/cm$^2$.

3. The method according to claim 1, wherein the scanning of the focused laser spot is performed using an F-θ scanning system that includes a scanning mirror.

4. The method according to claim 3, further comprising controlling a duration of the focused laser spot by passing the laser beam through an acousto-optical modulator prior to the laser beam reaching the F-θ scanning system.

5. The method according to claim 1, wherein the dwell time $t_d$ is in a range from 50 ns to 150 ns.

6. The method according to claim 1, wherein the laser beam has a wavelength of either 532 nm or 355 nm.

7. The method according to claim 1, further comprising measuring a change in a reflectivity of the at least one metal feature to determine whether the at least one metal feature melted during the scanning.

8. The method according to claim 1, further comprising directing the focused laser spot to the surface of the semiconductor wafer at an incident angle that is within 2 degrees of a Brewster angle for the at least one metal feature.

9. The method according to claim 8, wherein the metal comprises copper and the Brewster angle is about 70.5 degrees.

10. The method according to claim 1, wherein the scanning is carried out over multiple scan path segments that partially overlap one another.

11. A method of processing a metal layer having a first resistivity and formed on a surface of a semiconductor wafer, comprising:
forming a focused laser spot from a P-polarized laser beam emitted by a continuous-wave or quasi-continuous wave laser; and
scanning the focused laser spot over the metal layer so as to provide the focused spot with a dwell time, $t_d$, of a length sufficient such that the metal layer locally melts and recrystallizes so that the metal layer has a second resistivity that is less than the first resistivity.

12. The method according to claim 11, wherein the focused laser spot has an irradiance of at least $0.5 \times 10^7$ W/cm$^2$.

13. The method according to claim 11, wherein the scanning of the focused laser spot is performed using an F-θ scanning system that includes a scanning mirror.

14. The method according to claim 13, further comprising controlling a duration of the P-polarized laser beam by passing the P-polarized laser beam through an acousto-optical modulator prior to the laser beam reaching the F-θ scanning system.

15. The method according to claim 11, wherein the dwell time $t_d$ is in a range from 50 ns to 150 ns.

16. The method according to claim 11, wherein the P-polarized laser beam has a wavelength of either 532 nm or 355 nm.

17. The method according to claim 11, further comprising measuring a change in a reflectivity of the metal layer to determine whether the metal layer locally melted during the scanning.

18. The method according to claim 11, further comprising directing the focused laser spot to the surface of the semiconductor wafer at an incident angle that is within 2 degrees of a Brewster angle for the metal layer.

19. The method according to claim 11, wherein the metal layer comprises copper.

20. The method according to claim 11, wherein the scanning is carried out over multiple scan path segments that partially overlap.

21. A system for processing a semiconductor wafer that supports either a metal layer or integrated circuit structures having at least one metal feature, the system comprising:
a continuous or quasi-continuous laser source configured to generate a laser beam that is P-polarized relative to the metal layer or the integrated circuit structures;
an acousto-optical modulator that receives the laser beam and forms therefrom first and second laser beams, with the second laser beam being directed to a beam dump; and
an F-θ scanning system configured to receive the first laser beam and form therefrom a focused laser beam that forms a focus spot FS that is scanned over either the metal layer or the IC structures so as to provide the focused spot with a dwell time, $t_d$, of a length sufficient to locally melt the metal layer or the at least one metal feature of the IC structures.

22. The system according to claim 21, wherein the metal layer or at least one metal feature is made of copper.

23. The system according to claim 21, wherein the laser beam has a wavelength of either 532 nm or 355 nm.

24. The system according to claim 21, wherein the focused laser beam is made incident on the metal layer or the at least one metal feature at an incident angle that is within 2 degrees of a Brewster angle for the metal that constitutes the metal layer or the at least one metal feature.

25. The system according to claim 21, further comprising:
a first power detector arranged to receive a portion of the first laser beam and generate a first detector signal SA;
a second power detector arranged to receive reflected light from the focus spot FA that reflects from the at least one metal feature and generate a second detector signal SB; and
a controller operably connected to the first and second power detectors and configured to receive the first and second detector signals SA and SB and calculate therefrom a reflectivity RS of the at least one metal feature or the metal layer.

* * * * *